(12) United States Patent
Warnes et al.

(10) Patent No.: US 6,291,014 B1
(45) Date of Patent: Sep. 18, 2001

(54) ACTIVE ELEMENT MODIFIED PLATINUM ALUMINIDE DIFFUSION COATING AND CVD COATING METHOD

(75) Inventors: Bruce M. Warnes, Muskegon; Daniel L. Near, Montague; David C. Punola, Muskegon; William C. Basta, Montague, all of MI (US)

(73) Assignee: Howmet Research Corporation, Whitehall, MI (US)

( * ) Notice: Subject to any disclaimer, the term of this patent is extended or adjusted under 35 U.S.C. 154(b) by 68 days.

(21) Appl. No.: 09/392,766

(22) Filed: Sep. 7, 1999

Related U.S. Application Data

(62) Division of application No. 08/685,380, filed on Jul. 23, 1996, now Pat. No. 5,979,733.

(51) Int. Cl.[7] .................................................. C23C 16/08
(52) U.S. Cl. .................. 427/252; 427/253; 427/255.39; 427/255.393; 427/255.395; 205/192; 205/228; 148/527
(58) Field of Search .................................... 427/253, 252, 427/255.39, 255.393, 255.395; 205/192, 228; 148/527

(56) References Cited

U.S. PATENT DOCUMENTS

| | | | |
|---|---|---|---|
| 2,772,985 | 12/1956 | Wainer | 117/71 |
| 3,486,927 | 12/1969 | Ganje | 117/107.2 |
| 3,617,359 | 11/1971 | Wakefield | 117/107.2 R |
| 3,951,642 | 4/1976 | Chang et al. | 75/5 R |
| 3,961,098 | 6/1976 | Bessen | 427/34 |
| 3,976,436 | 8/1976 | Chang | 29/196.6 |
| 4,071,638 | 1/1978 | Chang et al. | 427/192 |
| 4,687,684 | 8/1987 | Restall et al. | 427/248.1 |
| 4,698,244 | 10/1987 | Benander | 427/253 |
| 4,701,384 | 10/1987 | Sarin et al. | 428/688 |
| 4,702,970 | 10/1987 | Sarin et al. | 428/688 |
| 4,745,010 | 5/1988 | Sarin et al. | 427/255 |
| 4,751,109 | 6/1988 | Sarin et al. | 427/255 |
| 4,758,451 | 7/1988 | Vandenberg et al. | 427/249 |
| 4,801,513 * | 1/1989 | Duhl et al. | |
| 4,835,011 | 5/1989 | Olson et al. | 427/253 |
| 4,844,951 | 7/1989 | Sarin et al. | 427/255 |
| 4,890,574 | 1/1990 | Sarin et al. | 118/719 |
| 4,931,425 | 6/1990 | Kimura et al. | 505/1 |
| 4,943,450 | 7/1990 | Sarin et al. | 427/255.2 |
| 5,015,502 | 5/1991 | Strangman et al. | 427/248.1 |
| 5,057,196 | 10/1991 | Creech et al. | 204/181.5 |
| 5,071,678 | 12/1991 | Grybowski et al. | 427/253 |
| 5,147,683 | 9/1992 | Tanaka et al. | 427/69 |
| 5,149,514 | 9/1992 | Sanjurjo | 423/344 |
| 5,275,840 | 1/1994 | Mikami | 427/66 |
| 5,292,594 | 3/1994 | Liburdi et al. | 428/650 |
| 5,455,119 | 10/1995 | Taylor et al. | 428/632 |
| 5,514,482 | 5/1996 | Strangman | 428/623 |
| 5,562,998 | 10/1996 | Strangman | 428/612 |
| 5,624,721 | 4/1997 | Strangman | 428/585 |
| 5,645,893 | 7/1997 | Rickerby et al. | 427/405 |
| 5,650,235 | 7/1997 | McMordie et al. | 428/610 |
| 5,658,614 * | 8/1997 | Basta et al. | |
| 5,807,613 * | 9/1998 | Aguero et al. | |

FOREIGN PATENT DOCUMENTS

| | | |
|---|---|---|
| 92/03587 | 3/1992 | (WO) . |
| 96/15284 | 5/1996 | (WO) . |

* cited by examiner

*Primary Examiner*—Timothy Meeks

(57) ABSTRACT

A CVD outwardly grown platinum aluminide diffusion coating on a nickel or cobalt base superalloy substrate wherein the platinum modified aluminide diffusion coating is modified to include silicon, hafnium, and optionally zirconium and/or other active elements (e.g. Ce, La, Y, etc.) each in a concentration of about 0.01 weight % to about 8 weight % of the outer additive (Ni,Pt)(Al,Si) layer of the coating. A particular coating includes about 0.01 weight % to less than 2 weight % of each of silicon, hafnium, and zirconium in the outer additive layer, preferably with a Hf/Si ratio less than about 1 and, when Zr also is present, a Hf+Zr/Si ratio of less than about 1. A coating microstructure is provided characterized by an inner diffusion zone or region adjacent the substrate and the outer additive (Ni,Pt)(Al,Si) layer including hafnium silicide second phase particles or regions dispersed throughout the outer additive layer of the coating.

15 Claims, 4 Drawing Sheets

ACTIVE ELEMENT MODIFIED PLATINUM ALUMINIDE DIFFUSION COATING AND CVD COATING METHOD

This is a division of Ser. No. 08/685,380 filed Jul. 23, 1996 now U.S. Pat. No. 5,919,733.

FIELD OF THE INVENTION

The present invention relates to active element modified platinum aluminide diffusion coatings and chemical vapor deposition (CVD) methods for their manufacture.

BACKGROUND OF THE INVENTION

At temperatures greater than about 1000° C. (1832° F.), high temperature oxidation is the most important form of environmental attack observed with aluminide diffusion coatings. High temperature oxidation is a chemical reaction whose rate controlling process for an aluminide coating is diffusion through a product (oxide) layer. Diffusion is a thermally activated process, and consequently, the diffusion coefficients are exponential functions of temperature. Since the oxidation of aluminide coatings is a diffusion controlled reaction and diffusion coefficients are exponential functions of temperature., the oxidation rate is also an exponential function of temperature. At low temperatures where diffusion coefficients are relatively small, the growth rate of a protective scale on any aluminide coating is also small. Thus, adequate oxidation resistance should be provided by any state of the art aluminide coatings, such as: chromium aluminide, aluminide or two phase [PtAl$_2$+(Ni,Pt)Al] platinum aluminide, all inward grown coatings made by pack cementation. However, at high temperatures where the diffusion coefficients and consequently the oxidation rate increase rapidly with increasing temperature, only coatings which form high purity alumina (Al$_2$O$_3$) scales are likely to provide adequate resistance to environmental degradation.

The presence of platinum in nickel aluminide has been concluded to provide a number of thermodynamic and kinetic effects which promote the formation of a slow growing, high purity protective alumina scale. Consequently, the high temperature oxidation resistance of platinum modified aluminide diffusion coatings generally is better as compared to aluminide diffusion coatings not containing platinum.

In recent years, several limitations of the industry standard, two phase [PtAl$_2$+(Ni,Pt)Al], inward grown platinum aluminide coatings have been identified. First, the two phase coatings have metastable phase assemblages and thicknesses, as demonstrated in engine tests at both General Electric and Rolls-Royce. Second, the two phase coatings are sensitive to TMF cracking in engine service, and the growth of these coatings in service only makes this problem worse. Third, the thick, inward grown platinum aluminides exhibit rumpling during both cyclic oxidation and engine testing. This phenomenon can have undesirable consequences when platinum aluminide coatings are used as the bond coat in thermal barrier coating systems. Fourth, the two phase platinum aluminide coatings are hard and brittle, and this can result in chipping problems during post coat handling and assembly operations.

Many of the problems encountered with the previous industry standard platinum aluminides can be attributed to the two phase, inward grown structure and can be overcome by using outwardly grown, single phase platinum aluminde coatings as described, for example, in the Conner et al. technical articles entitled "Evaluation of Simple Aluminide and Platinum Modified Aluminide Coatings on High Pressure Turbine Blades after Factory Engine testing", Proc. AMSE Int. Conf. of Gas Turbines and Aero Engine Congress Jun. 3–6, 1991 and Jun. 1–4, 1992. For example, the outwardly grown, single phase coating microstructure on directionally solidified (DS) Hf-bearing nickel base superalloy substrates was relatively unchanged after factory engine service in contrast to the microstructure of the previous industry standard two phase coatings. Further, the growth of a CVD single phase platinum aluminide coating was relatively insignificant compared to two phase coatings during factory engine service. Moreover, the "high temperature low activity" outward grown platinum aluminde coatings were observed to be more ductile than inward grown "low temperature high activity" platinum aluminide coatings.

Copending application Ser. No. 08/330,694, now U.S. Pat. 5,658,614, of common assignee herewith described a CVD process for making a single phase outwardly grown platinum aluminide diffusion coating on a nickel base superalloy substrate, such as IN 738.

Copending applications Ser. Nos. 08/197,478 and 08/197,497 also of common assignee disclose CVD methods for codeposition of aluminum, silicon and one or more active elements, such as yttrium, hafnium and/or zirconium, on a substrate to form a platinum aluminide diffusion coating modified by the inclusion of the active element(s).

SUMMARY OF THE INVENTION

The present invention provides a CVD outwardly grown platinum aluminide diffusion coating on a nickel or cobalt base superalloy substrate wherein the platinum modified aluminide diffusion coating is modified to include silicon, hafnium, and optionally zirconium and/or other active elements (e.g. Ce, La, Y) each in a concentration of about 0.01 weight % to about 8 weight % of the outer additive layer of the coating. A preferred coating of the present invention includes about 0.01 weight % to less than 2 weight % of each of silicon, hafnium, and optionally zirconium and/or other active elements in the outer additive layer, preferably with a Hf/Si ratio less than about 1 and, when Zr also is present, a Hf+Zr/Si ratio of less than about 1. A coating microstructure is provided characterized by an inner diffusion zone or region adjacent the substrate and the outer additive layer having a single (Ni,Pt)(Al,Si) matrix phase including hafnium silicide and other silicide second phase particles or regions dispersed throughout the matrix phase of the additive layer. Carbide particles may also be present.

The present invention also provides a thermal barrier coating system including the aforementioned CVD outwardly grown active element modified platinum aluminide diffusion coating as an intermediate bond coat between a nickel or cobalt base superalloy substrate and an outer ceramic thermal barrier layer, such as an physical vapor deposited (PVD) columnar ceramic layer deposited on a thin alumina layer formed on the bond coat.

The present invention also provides a method of making such CVD active element modified platinum aluminide diffusion coatings on nickel or cobalt base superalloy substrates wherein in one embodiment a platinum layer first is deposited on the substrate followed by CVD codeposition of Al+Si+Hf+optionally Zr and/or other active elements to produce a diffusion coating useful, although not limited, for service applications in the hot turbine section of a gas turbine aircraft engine where shorter overhaul intervals are practiced.

A method in accordance with another embodiment of the present invention involves first CVD codepositing Al+Si+Hf+optionally Zr and/or other active elements on the substrate to form an initial active element bearing aluminide diffusion layer, then depositing platinum on the layer, and finally CVD aluminizing the Pt coated initial layer to produce a thicker overall aluminide diffusion coating useful, although not limited, for service applications where longer overhaul intervals can be tolerated, such as land based gas turbine engines.

DETAILED DESCRIPTION

The present invention provides a CVD outwardly grown active element modified platinum aluminide diffusion coating on a nickel or cobalt base superalloy substrate, especially a single crystal superalloy substrate, to substantially improve oxidation resistance at elevated temperatures.

Chemical vapor deposition (CVD) is a process which is used for the transport of aluminum and one or more active elements as halide gases from a low temperature metal halide generator to a susbtrate, such as a high pressure nickel or cobalt superalloy turbine component, positioned inside a high temperature reactor. In the practice of the present invention, a CVD process can be advantageously employed to form the outwardly grown active element modified platinum aluminide diffusion coating on a nickel or cobalt base superalloy substrate. That CVD process involves exposure of the superalloy substrate at an elevated substrate coating temperature of at least 1000 degrees C in the coating reactor or retort to a high purity coating gas comprising a mixture of hydrogen and aluminum trichloride gases and others in a manner that decreases the concentration of substitutional alloying elements, such as refractory elements present in the substrate (e.g. Ta, W, Mo, Ti, Re, etc.), and surface active solute elements, such as S, P, B, in an outwardly grown platinum aluminide diffusion coating, further details of that CVD process being available in copending application Ser. No. 08/330 694, now U.S. Pat. No. 5,658,614, the teachings of which are incorporated herein by reference.

Figure 3A:
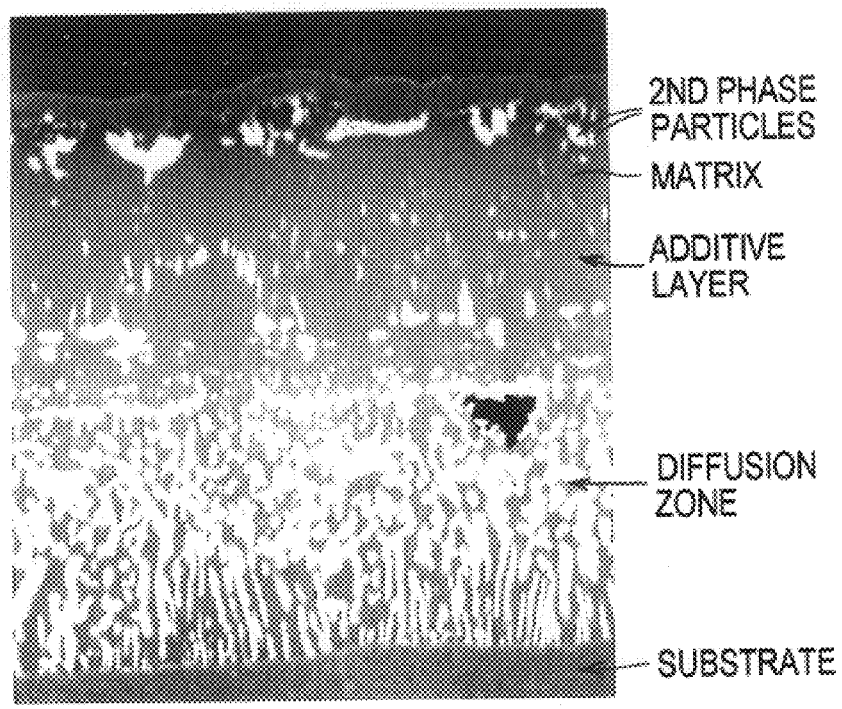
FIGS. 3A, 3B are photomicrographs at 1000× of the microstructure of a representative coating of the present invention designated MDC-151L on respective substrates as coated of conventional PWA 1480 and Rene' N5 nickel superalloys.
Figure 3B:
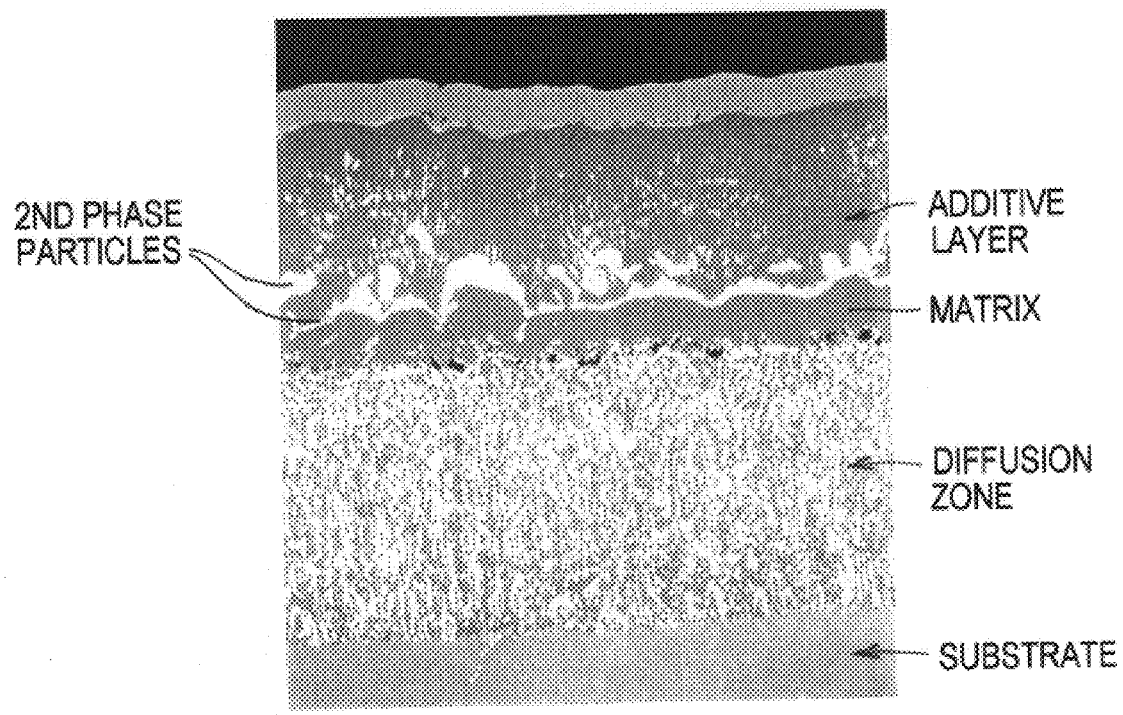

The CVD outwardly grown active element modified platinum aluminide diffusion coating in accordance with the present invention is modified to include silicon, hafnium, and optionally zirconium and/or other active elements, such as Ce, La, Y, etc., each in a concentration of about 0.01 weight % to 8 weight % of the outer additive portion of the coating represented by (Ni,Pt)(Al,Si), see FIGS. 3A, 3B showing the outer additive layer and the inner diffusion zone or layer adjacent the substrate of the coating as-coated. Preferably, the concentration of the hafnium and ziconium and/or other active elements, if present, is maximum at approximately 2 weight % in the region of the additive layer io adjacent the diffusion zone and decreases toward the outer surface of the additive layer to a trace concentration. The concentration of the silcion is within the above range generally uniformly through the additive layer. The concentration of the platinum is a maximum of approximately 35 weight % near the outer surface of the additive layer and decreases toward the diffusion zone to a lower concentration near the diffusion zone; e.g. as low as 5 weight % or less.

The overall Pt concentration in the additive layer of the coating is 10 to 30 weight %. The overall Al concentrations of the additive layer are 10 to 30 weight % Al. The diffusion zone includes mostly refractory elements as intermetallic or carbide phases.

A preferred coating of the present invention in as-coated condition includes about 0.01 weight % to less than 2 weight % of each of silicon, hafnium, and optionally zirconium and/or other active elements preferably with a Hf/Si ratio less than about 1 and, when Zr also is present, a Hf+Zr/Si ratio of less than about 1. A more preferred coating as-coated includes from about 0.25 to about 0.75 weight % Si and about 0.075kto about 0.125 weight % Hf. A particular coating includes 0.5 weight % Si and 0.1 weight % Hf in the as-coated condition.

The CVD outwardly grown active element modified platinum aluminide diffusion coating in accordance with the present invention includes a coating microstructure characterized by an inner diffusion zone or layer adjacent the substrate and a (Ni,Pt)(Al,Si) outer additive layer, FIGS. 3A, 3B. Importantly, the outer additive layer includes second phase particles or regions (shown as the light particles or regions in FIG. 3A, 3B) comprising primarily hafnium suicides with some zirconium silicide and hafnium+zirconium suicides present preferably present as spheres or needles dispersed throughout the outer additive layer of the coating. Other particles or regions also may be present in the additive layer in the as-coated condition and may include carbides of hafnium, zirconium and hafnium+zirconium formed by reaction with carbon in the substrate alloy.

Figure 1:
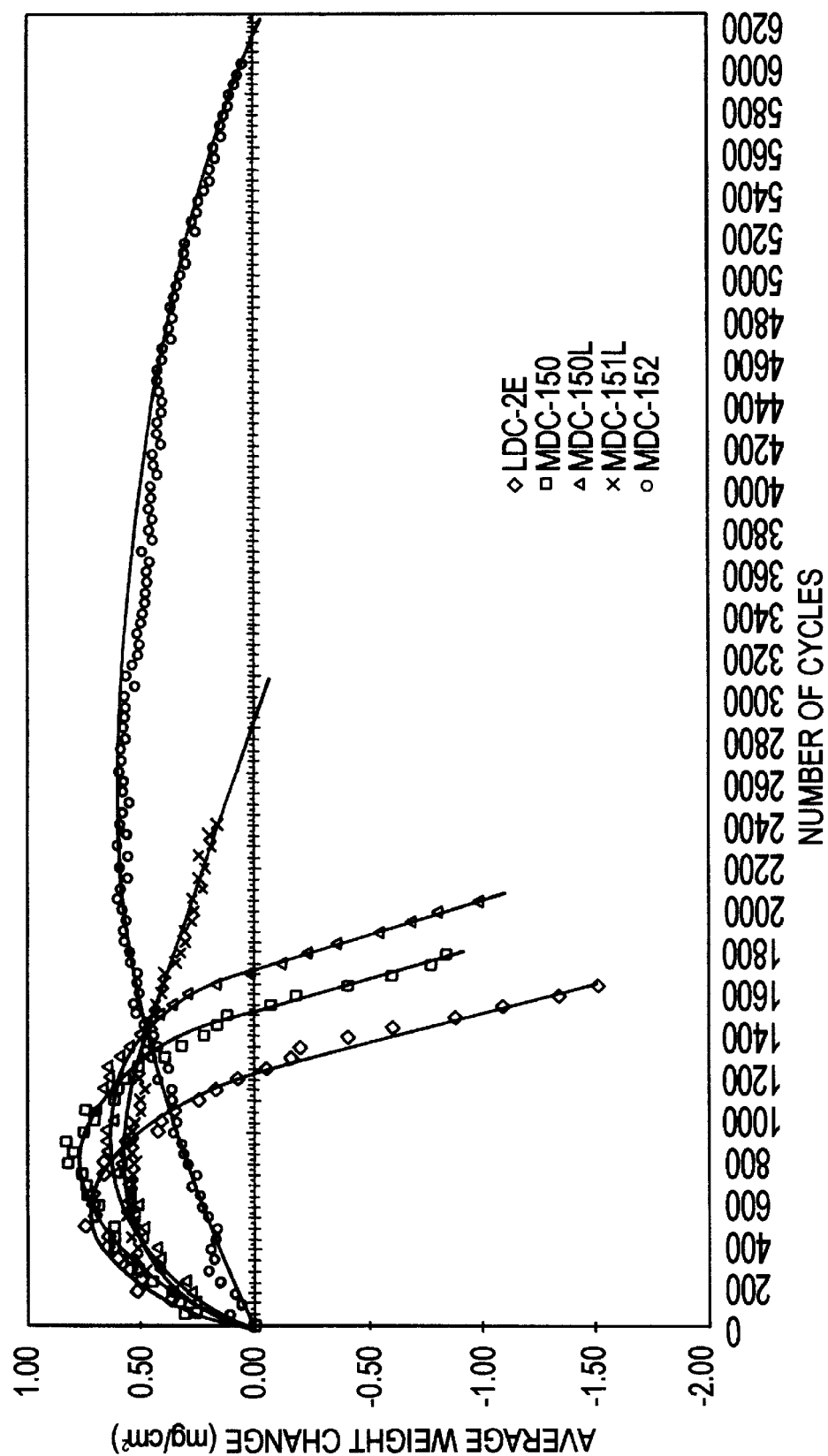
FIG. 1 is a graph depicting comparative cyclic oxidation resistance at 2000 degrees F of a conventional aluminide coating, such as an inwardly grown platinum aluminde coating designated LDC-2E and an inwardly grown CVD platinum aluminide MDC-150, an outwardly grown single phase CVD platinum aluminide diffusion coating designated MDC-150L, and coatings in accordance with the present invention designated MDC-151L and MDC152L, all coatings being formed on substrates of conventional IN 738 nickel base superalloy.

The CVD outwardly grown active element modified platinum aluminide diffusion coating in accordance with the present invention exhibits substantially improved high temperature oxidation resistance as illustrated in FIG. 1 wherein FIG. 1 is a graph depicting comparative cyclic oxidation resistance at 2000 degrees F of a conventional aluminide coating, such as an inwardly grown platinum aluminide coating designated LDC-2E and MDC-150, an outwardly grown single phase platinum aluminide diffusion coating designated MDC-150L, and coatings in accordance with the present invention designated MDC-151L and MDC152L, all coatings being formed on IN 738 nickel base superalloy substrates in the form of test tabs having dimensions of 1/8 inch by 1/2 inch by 1 inch.

The coating parameters for each coating formed are set forth herebelow:

The predominantly inwardly grown LDC-2E platinum aluminide coating was formed at a substrate temperature of 982 degrees C using a pack composition comprising 33% by weight alloy powder (56 weight % Cr and 44 weight % Al) and balance alumina. The substrate was first electroplated with Pt (9–11 milligrams/centrimeter squared) and diffused into the substrate by heat treatment at a temperature of 1052 degrees C for 1 hour prior to pack cementation. Pt was electroplated from a plating bath based upon a $HPO_4/H_2PO_4$ buffer at a current density of 0.09 amperes per square centimeters pursuant to U.S. Pat. Nos. 3,677,789 and 3,819,338.

The inwardly grown CVD platinum modified aluminide coating MDC-150 was formed at a substrate temperature of 1010 ° C. using coating gas mixture comprising 12 volume % aluminum chlorides ($AlCl_3$, $AlCl_2$ and $AlCl$) and 88 volume % hydrogen. The coating gas mixture was generated by passing hydrogen and hydrogen chloride in mixture of hydrogen/12 volume % HCl over a 99.999% pure external source of aluminum at 290° C. and then passing the mixture through a high temperature generator in the coating retort at 1010 degrees C to form a mixture of aluminum trichlorides and subchlorides. The substrate was first electroplated with Pt (9–11 milligrams/ centrimeter squared) as described above and diffused into the substrate by heat treatment at a temperature of 926 degrees C for 2 hours prior to CVD aluminizing.

The outwardly grown CVD single phase platinum aluminide coating MDC-150L was formed at a substrate temperature of 1080 OC using coating gas mixture comprising 5.5 volume % aluminum trichloride, 94.5 volume % hydrogen at a flow rate of 230 scfh in calculation of volume %'s. The coating gas mixture was generated by passing high purity hydrogen (e.g. less than 30 ppb impurities) and high purity hydrogen chloride (e.g. less than 25 ppm impurities) in mixture of hydrogen/15 volume % HCl over a high purity 99.999% pure external source of aluminum at 290° C. The HCl which produced the purification of the substrate and coating was produced by the hydrogen reduction of aluminum trichloride on the sample surface. The substrate was first electroplated with Pt (9–11 milligrams/centrimeter squared) as described above without a prediffusion heat treatment prior to CVD aluminizing.

The active element modified platinum aluminide diffusion coating MDC-151L of the present invention was formed pursuant to a two step method of the invention involving depositing platinum on the substrate and then CVD codepositing Al+Si+Hf+optionally Zr on the Pt layer to form a active element bearing platinum aluminide diffusion coating. CVD apparatus of the type shown in U.S. Pat. No. 5,261,963 can be employed. The substrate first was electroplated with Pt (9–11 milligrams/centrimeter squared) as described above without any diffusion heat treatment of the platinum layer prior to CVD codeposition. Higher Pt amounts can be deposited, if desired, to further improve oxidation resistance of the coating. Electroplating of the platinum layer alternately can be achieved using an aqueous potassium hydroxide solution having greater than about 9 grams per liter potassium hydroxide having less than 5 parts per million sulfur and phosphorus and about 10–11 grams platinum per liter added to solution as hexahydroxy platinic acid having less than 5 parts per million sulfur and phosphorous and less than 10 parts per million chlorine at a solution temperature of about 70 degrees C and pH of greater than 11.2 and less than 11.9 and electrical current density less than 0.020 ampere/cm (e.g. 0.015 ampere/cm) as described in copending application entitled "Platinum Modified Aluminide Diffusion Coating And Method" Ser. No. 08/685,379, now U.S. Pat. No. 5,788,823, the teachings of which are incorporated herein by reference to this end. The second step was conducted at a substrate temperature of 1080 ° C. using coating gas mixture comprising 4 volume % silicon tetrachoride and aluminum trichloride (greater than 90% by volume aluminum trichloride), 79.5 volume % hydrogen, 15 volume % Ar, and 1.5 volume % $HfCl_4$ and $ZrCl_4$ [(coating gas flow rate of 200 standard cubic feet per hour (scfh) and total pressure of 150 Torr]. The coating gas mixture was generated by passing high purity hydrogen (e.g. less than 30 ppb impurities) and high purity hydrogen chloride (e.g. less than 25 ppm impurities) in mixture of hydrogen/10 volume % HCl over a high purity 99.999% pure source of aluminum and then passing the mixture over a high purity 99.999% pure source of silicon with both sources at 290 degrees C (sources external of retort) to form a mixture of aluminum trichloride and silicon tetratrichloride as disclosed in copending application Ser. Nos. 08/197 349 and 08/197 497 of common assignee herewith, the teachings of which are incorporated herein by reference to this end. A mixture of Ar/10 volume % HCl was flowed in an external chloride generator through a hafnium bed at 430 ° C. to form hafnium tetrachloride containing a small amount (e.g. less than 1 volume %) of zirconium tetrachloride. The hafnium bed included a small concentration of zirconium, such as less than 1 weight % Zr. Alternately, the coating gas mixture can be flowed through a cogenerator having a hafnium bed and a zirconium bed downstream of the hafnium bed to form coating gas mixture. The gas mixtures were introduced concurrently to the coating retort to codeposit Al+Si+Hf+Zr on the IN 738 substrate. The HCl which produced the purification of the substrate and coating was produced by the hydrogen reduction of the various metal chloride gases on the sample surface.

The active element modified platinum aluminide diffusion coating MDC-152L of the present invention was formed pursuant to a three step method of the invention involving first CVD codepositing Al+Si+Hf+optionally Zr on the substrate to form an initial active element bearing aluminide diffusion layer, then depositing platinum on the layer, and finally CVD aluminizing the Pt coated initial layer to produce a thicker overall aluminide diffusion coating useful, although not limited, for service applications where longer overhaul intervals can be tolerated, such as land based gas turbine engines. CVD apparatus of the type shown in U.S. Pat. No. 5,261,963 can be employed. The first step was conducted at a substrate temperature of 1080 ° C. using coating gas mixture comprising 3.4 volume % aluminum trichloride and silicon tetrachloride (greater than 90% by volume aluminum trichloride), 82.6 volume % hydrogen, 12.7 volume % Ar, and 1.3 volume % HfCl, and $ZrCl_4$ (gas flow rate of 236 scfh and total pressure of 150 Torr). The coating gas mixture was generated by passing high purity hydrogen (e.g. less than 30 ppb impurities) and high purity hydrogen chloride (e.g. less than 25 ppm impurities) in mixture of hydrogen/10 volume % HCl over a high purity 99.999% pure external source of aluminum and then passing the mixture over a high purity 99.999% pure external source of silicon both sources at 290 degrees C to form a mixture of aluminum trichloride and silicon tetratrichloride as disclosed in copending application Ser. Nos. 08/197, 478 and 08/197 497 of common assignee herewith, the teachings of which are incorporated herein by reference to this end. A mixture of Ar/10 volume % HCl was flowed in an external chloride generator through a hafnium bed at 430° C. to form hafnium tetrachloride containing a small amount (e.g. less than 1 volume %) of zirconium tetrachloride. The hafnium bed included a small concentration of zirconium, such as less than 4–20 1.0 weight % Zr. The gas mixtures were introduced concurrently to the coating retort to codeposit Al+Si+Hf+Zr on the IN738 substrate. The HCl which produced the purification of the substrate and coating was produced by the hydrogen reduction of the various metal chloride gases on the sample surface. The substrate then was electroplated with Pt (9–11 milligrams/centrimeter squared) as described above without any diffusion heat treatment of the platinum layer prior to the third step. The third step was conducted at a substrate temperature of 1080 ° C. using coating gas mixture comprising 5.5 volume % aluminum trichloride, 94.5 volume % hydrogen (gas flow rate of 220 scfh and total pressure of 150 Torr). The coating gas mixture was generated by passing high purity hydrogen (e.g. less than 30 ppb impurities) and high purity hydrogen chloride (e.g. less than 25 ppm impurities) in mixture of hydrogen/15 volume % HCl over a high purity 99.999% pure source of aluminum external of the retort at 290 degrees C In the production of the MDC-150L, MDC-151L, and MDC-152L using the aforementioned CVD coating parameters, the concentrations of substitutional alloying elements, such as Cr, W, Mo, Ta, Fe and others, and surface active solute elements, such as S, P, B in the aluminide diffusion coating are significantly reduced as compared to their corresponding concentrations in the IN738 substrate by the purification effects of the CVD parameters as described in copending application Ser. No. 08/330,694, now U.S. Pat. No. 5,658,614, the teachings of which are incorporated herein by reference. The removal of these elements during the CVD process involves the chlorination of the metal and subsequent evaporation of the metal chlorides. Note ppb= parts per billion and ppm=parts per million in above description.

Examples of Cyclyclic Oxidation Testing of Platinum Aluminides

The evaluation of the aforementioned coatings for cyclic oxidation testing involved first examining coating structure and thickness to be tested. The following paragraphs summarize the results of the metallographic and electron microprobe analysis of these coatings in the as-coated condition.

Coating Structure and Thickness

In the as-coated condition, both the LDC-2E coating and MDC-150 coating exhibited a two phase outer layer on top of an (Ni,Pt)Al layer and finally a thin diffusion zone. This structure is typical of the present industry standard platinum aluminides. The MDC-150L coating exhibited a single phase (Ni,Pt)Al additive layer and about one third of the thickness was diffusion zone. The MDC-151L and MDC-152L coatings both exhibited an outer additive layer having single (Ni,Pt)(Al,Si) matrix phase including primarily hafnium silicide particles (lighter phase) with some zirconium silicide and possibly some hafnium+zirconium suicides dispersed throughout the matrix phase of the additive layer, similar to FIG. 3, and about one third of the thickness was diffusion zone adjacent the substrate. A well developed diffusion zone is characteristic of a growth process dominated by the outward transport of nickel.

In the as coated condition, the coating thicknesses were as follows: LDC-2E coating=1.96 mils, MDC-150 coating= 2.11 mils, MDC-150L coating=3.13 mils, MDC-151LLcoating=3.4 mils, and MDC-152L coating=5.1 mils.

After solution heat treatment at 2050° F. for 120 minutes, both the LDC-2E and MDC-150 two phase coatings exhibited significant changes in structure, composition and thickness. The average Pt and Al concentrations decreased significantly, and the thicknesses increased about 52% and 67% for LDC-2E coating and MDC-150 coating, respectively. The MDC-150L coating was single phase and remained relatively unaffected. The microstructure of the MDC-151L and MDC-152L coatings did not change significantly after heat treatment, and these coatings had a single phase matrix with active element rich second phase particles, such as primarily hafnium silicide particles with some zirconium silicide and possibly some hafnium+ zirconium silicides, following the heat treatment. It should be noted that the observed metamorphoses of the two phase LDC-2E coating and MDC-150 coatings during the solution heat treatment is similar to the changes encountered during engine testing.

Cyclic Oxidation Test Results

The IN-738 test tabs with the the different platinum aluminide coatings were used for cyclic oxidation testing at 2000° F. A one hour cycle included: fifty minutes at temperature and ten minutes cooling to room temperature. Samples were weighed to the nearest 0.1 milligram (mg) before the test and after each fifty cycle test interval.

Failure was defined as a negative 0.5 milligram per square centimeters weight loss; that is, when the sample weight after a test interval was −0.5 mg/cm$^2$ less than the initial weight. For each coating, three samples were tested to failure, and then the cycles to failure were averaged.

The results of the testing are summarized in FIG. 1 and the Table below, which are based on three (3) samples tested for each type of coating.

TABLE

| 2000° F. CYCLIC OXIDATION OF COATED IN-738 | | |
|---|---|---|
| COATING | ONE HOUR CYCLES TO FAILURE | RELATIVE LIFE |
| LDC-2E | 1350 | 1 |
| MDC-150 | 1700 | 1.26 |
| MDC-150L | 1900 | 1.41 |
| MDC-151L | 3475 | 2.57 |
| MDC-152L | 7000 | 5.19 |

A comparison of the test results for the platinum modified aluminide coatings shows that the coatings MDC-151L and MDC-152L pursuant to the invention exhibited a substantial (e.g. 2 or more times) increase in relative life in the oxidation test as compared to the LDC-2E coating, MDC-150 coating, and MDC-150L coating. The superior oxidation resistance of the MDC-151L coating and MDC-152L coating compared to the others results from the purification effects produced by the particular CVD aluminizing parameters set forth above and also the presence of the active elements Hf and optional Zr. For example, the effect of the presence of the active elements is evident by comparing the MDC-151L coating and MDC-152L coating versus the MDC-150L coating devoid of active elements. The longer life of the MDC-152L coating relative to the MDC-151L coating in FIG. 1 is due to the greater thickness of the former relative to the latter since the MDC-151L and MDC-152L coatings are generally equal in oxidation resistance on a per mil of coating thickness basis, where Hf/Si ratio is the same for the coatings.

Based on the test results set forth in FIG. 1 and the Table, the CVD outward grown, active element modified platinum aluminide diffusion coatings of the invention represent a significant advancement in platinum modified aluminide coating technology.

Figure 2:
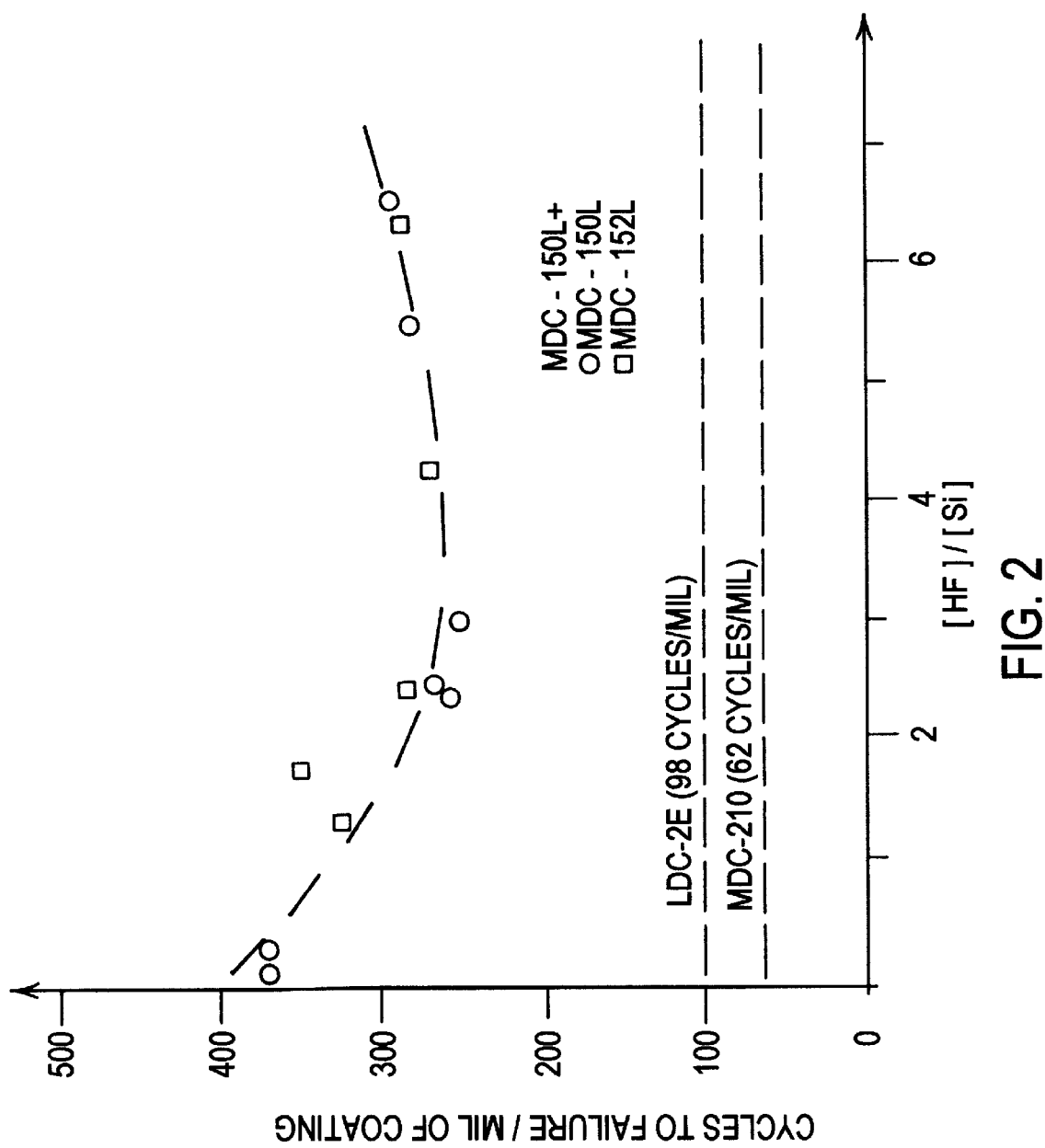
FIG. 2 is a graph depicting comparative cyclic oxidation resistance at 2150 degrees F of coatings in accordance with the present invention designated MDC-151L and MDC-152L at different Hf/Si ratios, all coatings being formed on substrates of conventional RENE' N5 nickel base superalloy.

A coating of the present invention includes an outer additive layer having hafnium and silicon in a preferred Hf/Si concentration ratio of less than about 1. When Zr also is present, the concentration ratio Hf+Zr/Si is less than about 1. Referring to FIG. 2, normalized cyclic oxidation life at 2150 degrees F versus the Hf/Si concentration ratio is plotted for samples designated MDC-151L and MDC-152L coatings made in the same manner as described hereabove. Sample failure was defined as a weight loss of −5 mg/cm$^2$ relative to the initial sample weight. The plot illustrates that the oxidation resistance of the coatings of the invention decreases by 60% as the Hf/Si ratio increases from a small fraction toward 2. This data was used to establish the preferred concentration Hf/Si ratio of less than about 1, or Hf+Zr/Si ratio of less than about 1 when Zr is present since Zr and Hf similarly affect coating behavior.

Using the CVD codeposition processes described hereabove for the MDC-151L and MDC-152L coatings, the distribution and morphology of hafnium silicide second phase particles can be changed within the preferred coatings of the invention wherein Hf/Si or Hf+Zr/Si is less than about 1. These changes can be effected by changing the HCl flow rate to the active element halide generators and/or cogenerators during the CVD codeposition of the coating. A uniform distribution of small hafnium silicide second phase particles as spherorids (e.g. diameter approximately 1 to 5 microns) or needles (e.g. approximately 1 to 5 microns length and approximately 0.5 to 1 micron thickness) in the single matrix phase of the outer additive layer is preferred for high temperature oxidation resistance. However, other distributions of the second phase particles may be used.

Figure 4:
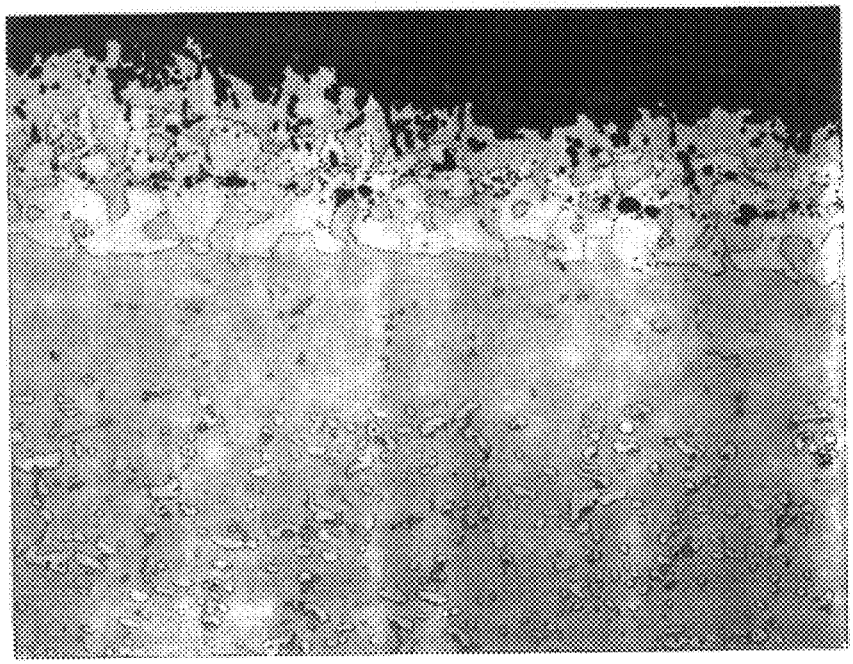
FIG. 4 is a photomicrograph at 500×of the microstructure of a representative coating of the present invention designated MDC-151L on PWA 1480 nickel superalloy substrate after exposure at 2150 degrees F for 250 hours.
Figure 5:
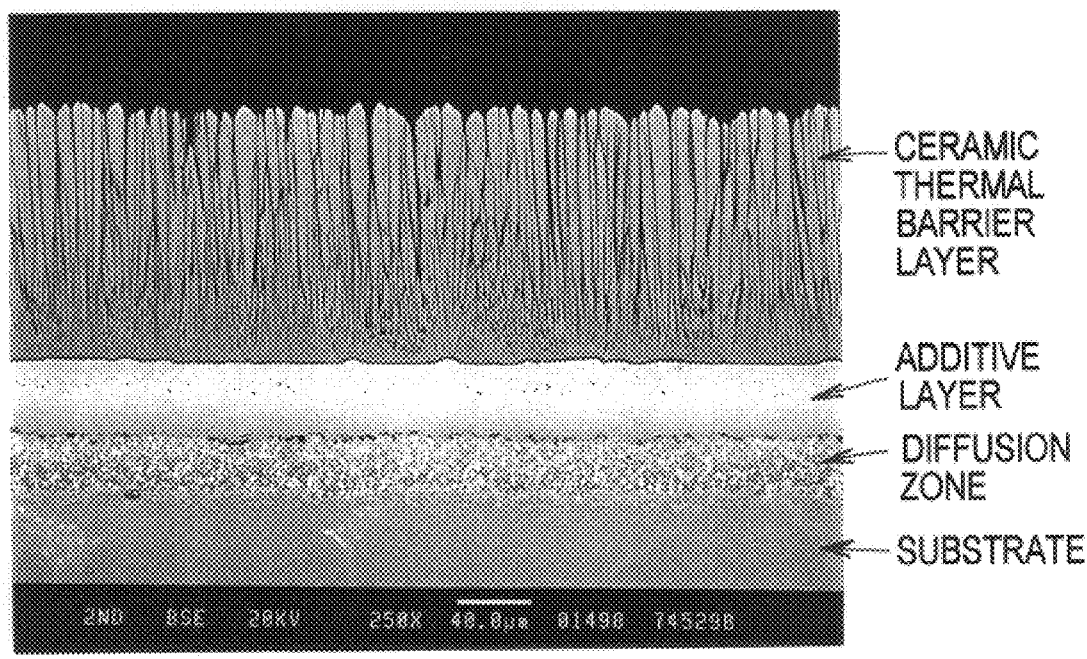
FIG. 5 is a photomicrograph at 250×of the microstructure of a representative thermal barrier coating of the present invention designated MDC-152L on Rene' N5 nickel superalloy substrate.

The active element modified platinum aluminide diffusion coating of the present invention is useful in thermal barrier coating systems wherein the CVD outwardly grown active element modified platinum aluminide diffusion coating is present as an intermediate bond coat between a nickel or cobalt base superalloy substrate and an outer ceramic thermal barrier layer, such as an physical vapor deposited (PVD) columnar ceramic layer deposited on a thin alumina layer formed on the bond coat. Referring to FIG. 3A, 3B, a MDC-151L coating of the present invention is shown on respective PWA 1480 and Rene' N5 substrates and includes acicular hafnium silicide particles (light colored particles) near the outer and inner surface of the outer additive layer of the coating in addition to being present at other regions of the additive layer. The presence of acicular second phase particles near the outer surface of the coating in FIG. 3A is possible with the MDC-151L coating of the invention. Referring to FIG. 4, a MDC-151L coating on the PWA 1480 substrate after an exposure of 250 hours to cyclic oxidation at 2150 degrees F is shown. The present of hafnium rich stringers at the outer surface of the coating is observed and may improve bonding of the ceramic thermal barrier layer, FIG. 5, to the aluminide diffusion coating (MDC-152L shown in FIG. 5).

Although the invention has been shown and described with respect to certain embodiments thereof, it should be understood by those skilled in the art that other various changes, modifications and omissions in the form and detail thereof may be made therein without departing from the spirit and scope of the invention.

What is claimed is:

1. A method of making an aluminide diffusion coating on a substrate, comprising:

chemical vapor codepositing Al, Si, and Hf on the substrate to form an initial aluminide diffusion layer, depositing a layer comprising platinum on said initial aluminide diffusion layer, and aluminizing said initial aluminide diffusion layer after said layer comprising platinum is deposited to produce an aluminide diffusion coating wherein said aluminide diffusion coating is outwardly grown to include an inner diffusion zone and an outer portion comprising a single phase aluminide matrix with second phase particles therein wherein said outer portion consists essentially of Ni, Pt, Si in a concentration of about 0.01 weight % to about 8 weight %, and Hf in a concentration of about 0.01 weight % to about 8 weight %, and said second chase particles comprise silicide including hafnium and silicon.

2. The method of claim 1 wherein the first step to form said initial layer is conducted at a substrate temperature of at least 1000° C.

3. The method of claim 2 wherein a coating gas mixture comprising aluminum trichloride, silicon tetrachloride, and hafnium tetrachloride, inert gas and hydrogen is contacted with the substrate.

4. The method of claim 3 wherein the coating mixture further includes zirconium tetrachloride to codeposit zirconium also.

5. The method of claim 1 wherein said layer comprising platiunum is deposited in the second step by electroplating platinum on said initial layer.

6. The method of claim 1 wherein said inital aluminide diffusion layer is aluminized by chemical vapor deposition of aluminum thereon at elevated temperature.

7. The method of claim 1 wherein said inital aluminide diffusion layer is aluminized without a prior diffusion heat treatment of said platinum layer.

8. The method of claim 1 wherein said inital aluminide diffusion layer is aluminized after a prior diffusion heat treatment of said platinum layer.

9. A method of making an aluminide diffusion coating on a substrate, comprising:

depositing a layer comprising platinum on said substrate, and chemical vapor codepositing Al, Si, and Hf on said substrate to form an aluminide diffusion coating having an inner diffusion zone and an outer portion including a single phase aluminide matrix with second phase particles therein wherein said outer portion consists essentially of Ni, Pt, Si in a concentration of about 0.01 weight % to about 8 weight %, and Hf in a concentration of about 0.01 weight % to about 8 weight and said second phase particles comprise silicide including hafnium and silicon.

10. The method of claim 9 wherein said second step is conducted at a temperature of at least 1000 degrees C.

11. The method of claim 10 wherein a coating gas mixture comprising aluminum trichloride, silicon tetrachloride, and hafnium tetrachloride, inert gas, and hydrogen gas is contacted with said layer comprising platinum.

12. The method of claim 11 wherein the coating gas mixture further includes zirconium tetrachloride to codeposit zirconium also.

13. The method of claim 9 wherein said layer comprising platinum is electroplated on said substrate.

14. The method of claim 9 including providing a Hf/Si ratio of less than about 1 in the outer portion.

15. The method of claim 9 wherein the outer portion further includes Zr and a Hf+Zr/Si ratio of less than about 1 is provided in the outer portion.

* * * * *

UNITED STATES PATENT AND TRADEMARK OFFICE
CERTIFICATE OF CORRECTION

PATENT NO.   : 6,291,014 B1
DATED        : September 18, 2001
INVENTOR(S)  : Bruce M. Warnes et al.

It is certified that error appears in the above-identified patent and that said Letters Patent is hereby corrected as shown below:

<u>Title page,</u>
Item [62], replace "5 979 733" with -- 5 989 733 --.

<u>Column 10,</u>
Line 23, after "coating" insert -- gas --.
Line 27, replace "platiunum" with -- platinum --.
Line 48, after "8 weight" insert -- %, --.

Signed and Sealed this

Seventh Day of May, 2002

*Attest:*

JAMES E. ROGAN
*Attesting Officer*   *Director of the United States Patent and Trademark Office*